United States Patent
Fu et al.

(10) Patent No.: US 10,490,472 B2
(45) Date of Patent: Nov. 26, 2019

(54) AIR CAVITY MOLD

(71) Applicant: QUALCOMM Incorporated, San Diego, CA (US)

(72) Inventors: Jie Fu, San Diego, CA (US); Hong Bok We, San Diego, CA (US); Manuel Aldrete, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 15/691,696

(22) Filed: Aug. 30, 2017

(65) Prior Publication Data

US 2019/0067141 A1    Feb. 28, 2019

(51) Int. Cl.
| | |
|---|---|
| *H01L 23/31* | (2006.01) |
| *H01L 23/00* | (2006.01) |
| *H01L 21/78* | (2006.01) |
| *H01L 21/56* | (2006.01) |
| *H01L 21/027* | (2006.01) |
| *H01L 21/683* | (2006.01) |

(52) U.S. Cl.
CPC ........ *H01L 23/315* (2013.01); *H01L 21/0273* (2013.01); *H01L 21/565* (2013.01); *H01L 21/6835* (2013.01); *H01L 21/78* (2013.01); *H01L 23/3114* (2013.01); *H01L 23/3121* (2013.01); *H01L 24/16* (2013.01); *H01L 24/81* (2013.01); *H01L 2224/16227* (2013.01); *H01L 2224/81191* (2013.01)

(58) Field of Classification Search
CPC ... H01L 23/315; H01L 21/0273; H01L 24/81; H01L 21/6835; H01L 23/3121; H01L 24/16; H01L 21/565; H01L 21/78; H01L 23/3114; H01L 2224/16227; H01L 2224/81191; H01L 2224/26175

See application file for complete search history.

(56) References Cited

U.S. PATENT DOCUMENTS

| | | | |
|---|---|---|---|
| 6,316,840 B1 * | 11/2001 | Otani ................... | B81C 1/0023 257/417 |
| 7,871,865 B2 | 1/2011 | Sengupta et al. | |
| 8,153,480 B2 | 4/2012 | Steenbruggen et al. | |
| 8,368,187 B2 | 2/2013 | Pagaila | |
| (Continued) | | | |

FOREIGN PATENT DOCUMENTS

| | | |
|---|---|---|
| JP | H09162693 A | 6/1997 |
| JP | 2004147028 A | 5/2004 |
| WO | 2008078898 A1 | 7/2008 |

OTHER PUBLICATIONS

International Search Report and Written Opinion—PCT/US2018/045346—ISA/EPO—dated Oct. 31, 2018.

*Primary Examiner* — Shaun M Campbell
(74) *Attorney, Agent, or Firm* — Muncy, Geissler, Olds & Lowe

(57) ABSTRACT

Conventional packages for 5G applications suffer from disadvantages including high mold stress on the die, reduced performance, and increased keep-out zone. To address these and other issues of the conventional packages, it is proposed to pre-apply a wafer-applied material, which remains in place, to form an air cavity between the die and the substrate. The air cavity can enhance the die's performance. Also, since the wafer-applied material can remain in place, the keep-out zone can be reduced. As a result, higher density modules can be fabricated.

26 Claims, 12 Drawing Sheets

(56) References Cited

U.S. PATENT DOCUMENTS

| | | |
|---|---|---|
| 8,749,056 B2 | 6/2014 | Kehrer et al. |
| 9,607,863 B1 | 3/2017 | Lee |
| 2007/0045819 A1* | 3/2007 | Edwards ................. H01L 23/04 257/704 |
| 2008/0224324 A1* | 9/2008 | Kawada .............. H01L 23/3121 257/778 |
| 2010/0013032 A1* | 1/2010 | Oppermann ............ H01L 21/56 257/415 |
| 2011/0147916 A1* | 6/2011 | Su .......................... H01L 21/54 257/692 |
| 2011/0156188 A1* | 6/2011 | Tu ..................... H01L 27/14618 257/432 |
| 2011/0215444 A1* | 9/2011 | Park ....................... H01L 23/48 257/629 |
| 2016/0013152 A1 | 1/2016 | Yu et al. |
| 2018/0151485 A1* | 5/2018 | Kao ..................... H01L 21/486 |
| 2018/0233423 A1* | 8/2018 | Lobianco ............ H01L 23/3135 |

\* cited by examiner

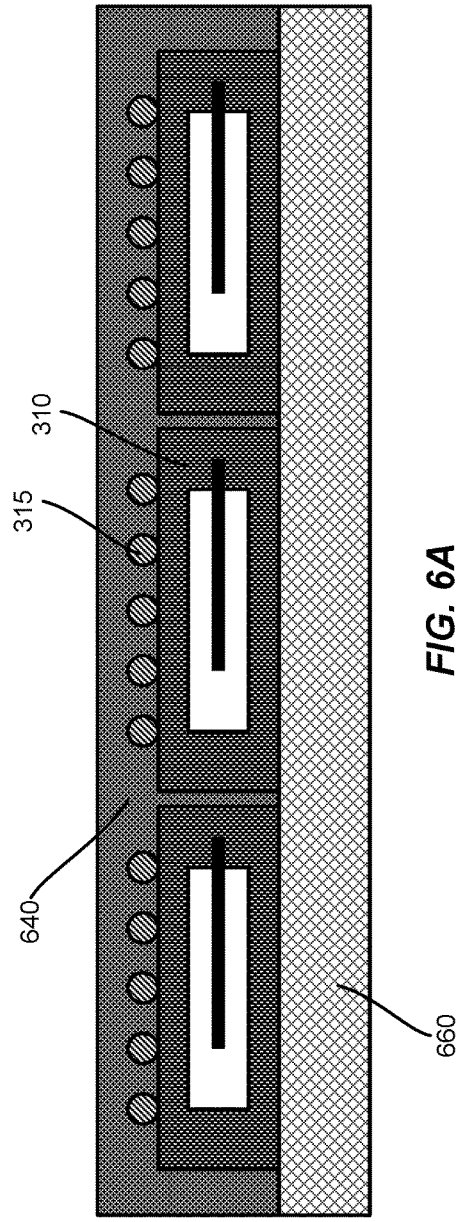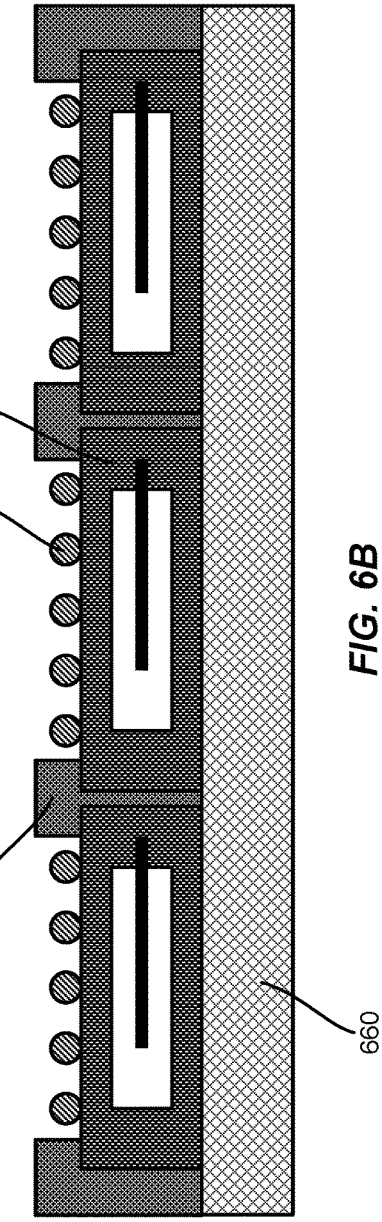
FIG. 6A
FIG. 6B

AIR CAVITY MOLD

FIELD OF DISCLOSURE

The field of the disclosed subject matter relates to device packages. In particular, the field of the disclosed subject matter relates to device packages with air cavities in molds and to methods of manufacturing the same.

BACKGROUND

In a conventional device package such as the device package 100 illustrated in FIG. 1, a die 110 is placed above a substrate 120 and the die 110 is encapsulated within a mold 130. The die 110 can include solder balls 115 to electrically couple with the substrate 120. As seen, the mold 130 can fill the space between the die 110 and the substrate 120—the "in-between space". For example, during fabrication, the material for the mold 130 may fill the in-between space through capillary action.

One disadvantage of the device package 100 is that there can be high mold stress on the die 110. For example, during the molding process, the die 110 can be subjected to high mold pressure. During operation of the device package 100, a mismatch in the coefficient of thermal expansion (CTE) among the die 110, the substrate 120 and the mold 130 can have reliability implications for the device package 100.

Another disadvantage is the relatively high ratio of the dielectric constant (Dk) to the dissipation factor (Df)—i.e., relatively high Dk/Df—of the mold 130. For example, the die 110 may be an electromagnetic compatibility (EMC) filter capable of high frequency operation. The EMC filter's performance can suffer as a result of the high Dk/Df of the mold 130.

FIG. 2 illustrates another conventional device package 200 that addresses the high Dk/Df problem. The device package 200 differs from the device package 100 in that the device package 200 includes underfill (UF) dams 240 that create an air cavity 250 in the in-between space, i.e., in the space between the die 110 and the substrate 120. The Dk/Df of air is low in comparison, and thus the performance of the die 110 can be improved.

During fabrication, the die 110 can be attached to the substrate 120, and the material for the UF dam 240 can be dispensed around the edge of the in-between space. Thereafter, the mold 130 can be formed. The UF dam 240, which is formed from an epoxy, prevents the mold 130 from flowing into the in-between space so as to maintain the air cavity 250.

One disadvantage of the device package 200 is that the UF material can bleed in all directions after being dispensed. In other words, the UF material does not remain in place during fabrication after being dispensed. As a result, the size of the air cavity 250 can be reduced. But perhaps more significant, the bleeding can result in an increase in the "keep-out" zone. For example, as seen in FIG. 2, the UF dam 240 can bleed out laterally away from the sidewalls of the die 110. To account for such bleed out, another component—e.g., passive capacitor, inductor, etc., or another die—must be placed far enough away so as to be unaffected by the bleed out. This can result in the component density being reduced.

SUMMARY

This summary identifies features of some example aspects, and is not an exclusive or exhaustive description of the disclosed subject matter. Whether features or aspects are included in, or omitted from this summary is not intended as indicative of relative importance of such features. Additional features and aspects are described, and will become apparent to persons skilled in the art upon reading the following detailed description and viewing the drawings that form a part thereof.

An exemplary package is disclosed. The package may comprise a substrate, a die above the substrate, and first and second dams between the die and the substrate. Inner and outer sidewalls of the first and second dams may be substantially vertical. The outer sidewalls of the first and second dams may be either vertically aligned with sidewalls of the die or may be outside of the sidewalls of the die. The package may also comprise a mold on the substrate. The mold may encapsulate the die and the first and second dams. An air cavity may be formed in the package. The air cavity may be bounded above by a lower surface of the die, bounded below by an upper surface of the substrate, and bounded on sides by the inner sidewalls of the first and second dams.

An exemplary method is disclosed. The method may comprise forming a substrate, and providing a die above the substrate. The method may also comprise forming first and second dams between the die and the substrate. The first and second dams may be formed such that inner and outer sidewalls of the first and second dams are substantially vertical. The first and second dams may also be formed such that outer sidewalls of the first and second dams are either vertically aligned with sidewalls of the die or are outside of the sidewalls of the die. The method may further comprise forming a mold on the substrate to encapsulate the die and the first and second dams. In the method, an air cavity may be formed in the package. The air cavity may be formed so as to be bounded above by a lower surface of the die, bounded below by an upper surface of the substrate, and bounded on sides by the inner sidewalls of the first and second dams.

Another exemplary package is disclosed. The package may comprise a substrate, a die above the substrate, and means for forming an air cavity between the die and the substrate. Inner and outer sidewalls of the means for forming the air cavity may be substantially vertical. The outer sidewalls of the means for forming the air cavity may be either vertically aligned with sidewalls of the die or may be outside of the sidewalls of the die. The package may also comprise means for encapsulating the die and the means for forming the air cavity on the substrate. The air cavity may be bounded above by a lower surface of the die, bounded below by an upper surface of the substrate, and bounded on sides by the inner sidewalls of the first and second dams.

BRIEF DESCRIPTION OF THE DRAWINGS

The accompanying drawings are presented to aid in the description of examples of one or more aspects of the disclosed subject matter and are provided solely for illustration of the examples and not limitation thereof.

FIGS. 6A-6F illustrate examples of different stages of fabricating the package of FIGS. 4A and 4B according to an aspect;

DETAILED DESCRIPTION

Figure 1:
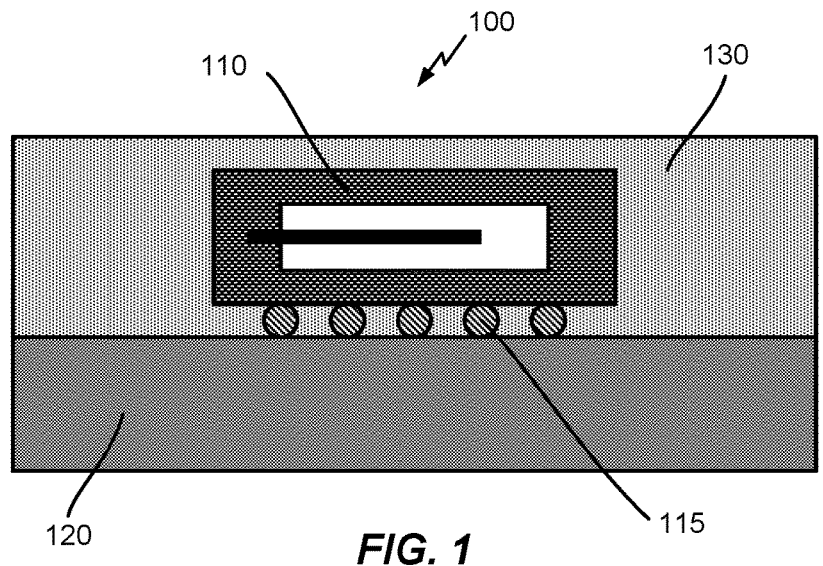
FIGS. 1 and 2 illustrate conventional packaging of an electromagnetic compatibility filter.
Figure 2:
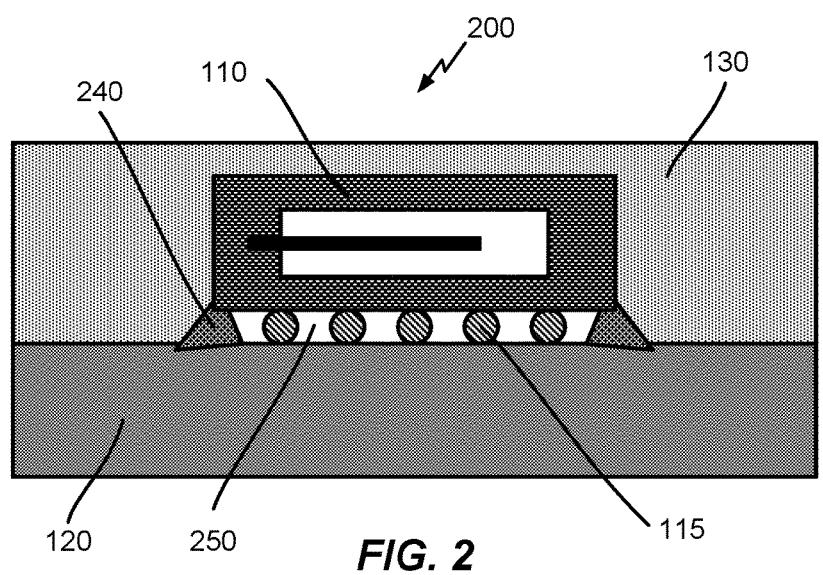

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

As indicated above, the disadvantages of the conventional packages include, among others, high mold stress on the die, reduced performance, and increased keep-out zone. To address these and other issues of the conventional packages, it is proposed to pre-apply a wafer-applied material, which remains in place, to form the air cavity. This can enable an easier process flow relative to conventional package fabricating techniques. Also, since the wafer-applied material can remain in place, the keep-out zone can be reduced. As a result, higher density device packages can be fabricated.

Figure 3A:
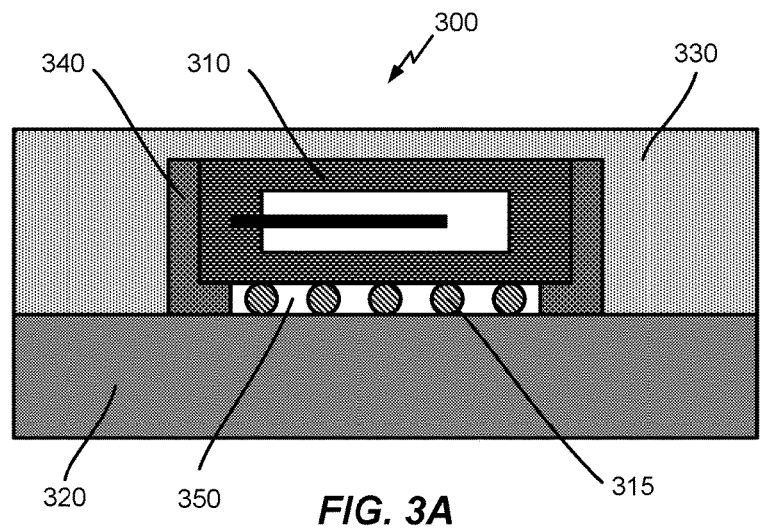
FIGS. 3A and 3B illustrate side and top views of an example package according to an aspect.
Figure 3B:
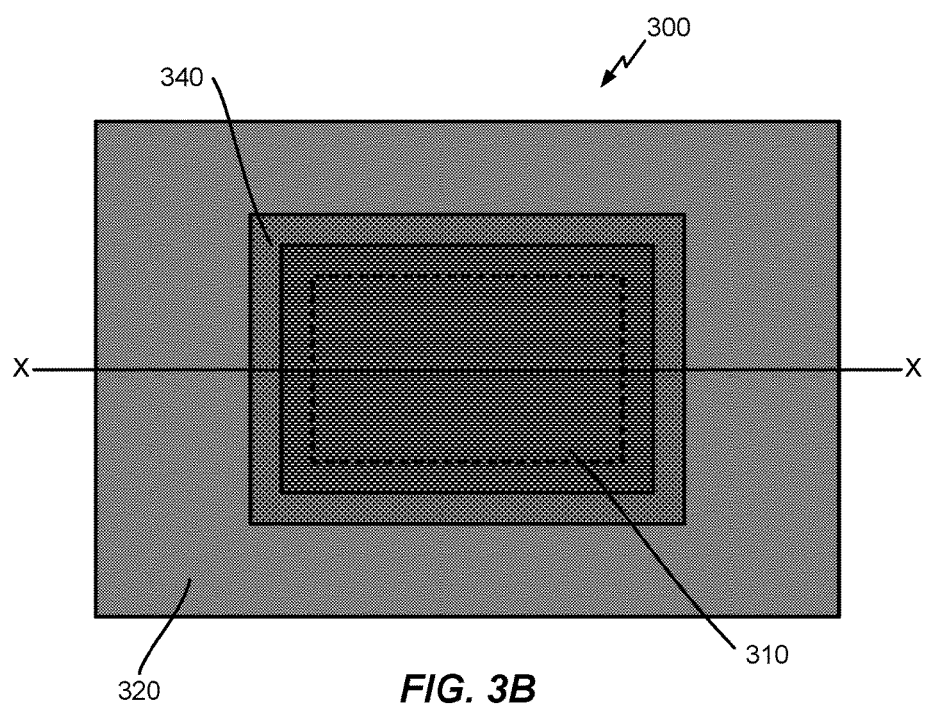

FIGS. 3A and 3B illustrate side and top views of an example package 300 according to an aspect. The view illustrated in FIG. 3A is a side view of the package 300 along the line X-X of FIG. 3B. As seen in FIG. 3A, the package 300 may include a die 310, a substrate 320, a mold 330, and left and right dams 340. The left and right dams may generically be referred to as first and second dams 340. The die 310 may include a plurality of interconnects 315 (e.g., ball grid array, solder balls, etc.) formed on its lower surface to electrically couple the die 310 with the substrate 320 (e.g., a printed circuit board (PCB)). It should be noted that terms such as "upper", "lower", "top", "bottom", "left", "right", "first", "second" and so on are used merely as terms of convenience, and should not be taken to be limiting.

The die 310 may be provided above the substrate 320, and the first and second dams 340 may be formed between the die 310 and the substrate 320. The mold 330 may be formed on the substrate 320, the die 310, and on the first and second dams 340. The mold 330 may be formed to encapsulate the die 310 as well as the first and second dams 340. The mold 330 may be viewed as being an example of means for encapsulating.

The die 310 may be an electronic device such as a 5G capable EMC filter. To enhance the performance of the die 310, an air cavity 350 may be formed in the in-between space, i.e., the space between the die 310 and the substrate 320. For example, the air cavity 350 may be bounded above by a lower surface of the die 310, bounded below by an upper surface of the substrate 320, and bounded on sides by inner sidewalls of the first and second dams 340. The first and second dams 340 may be viewed as examples of means for forming the air cavity 350. As indicated above, the low Dk/Df of the air cavity 350 can enhance the performance of the die 310. Some or all of the plurality of interconnects 315 may be within the air cavity 350.

In an aspect, the first and second dams 340 may actually be one physical dam 340 formed along a periphery of the die 310 as seen in FIG. 3B. However, the terms such as "first" and "second" will be used in this description so as to be more consistent with the side view of the package 300. In FIG. 3B, the mold 330 is omitted. Also, a dashed rectangle is provided for enhanced understanding. The dashed rectangle may be viewed as representing the side boundaries of the air cavity 350 when the package 300 is viewed vertically, (e.g., from the top or from the bottom).

Referring back to FIG. 3A, for ease of description, each of the first and second dams 340 may be divided into upper and lower dam portions. That is, first and second upper dam portions can be used respectively to refer to the portions of the first and second dams 340 above the lower surface of the die 310. Also, first and second lower dam portions can be used respectively to refer to the portions of the first and second dams 340 between the lower surface of the die 310 and the upper surface of the substrate 320. Then it may be said that the air cavity 350 is bounded by the inner sidewalls of the first and second lower dam portions.

In an aspect, some or all inner sidewalls of the first and second dams 340 may be substantially vertical. In FIG. 3A, the inner sidewalls of the first and second lower dam portions and the inner sidewalls of the first and second upper dam portions are illustrated as being substantially vertical. More generally, it may be said that the inner sidewalls of the first and/or the second dams 340 may be substantially parallel with the sidewalls of the die 310. Similarly, the outer sidewalls of the first and/or the second dams 340 may be substantially vertical, or more generally, substantially parallel with the sidewalls of the die 310.

A very distinct advantage of the sidewalls of the first and second dams 340 being parallel with the sidewalls of the die 310 is that the keep-out zone can be significantly reduced, and thereby allow tighter spacing between from adjacent dies and components. The keep-out zone reduction can be achieved by patterning the first and second dams 340 using a material that can retain its shape after being patterned, i.e., by using a material that does not bleed out in a significant manner. Thus, the material for the first and second dams 340 can be different from the material used for the mold 330. In an aspect, a photoresist (PR) material may be used for the first and second dams 340. Generally, a PR material is a light-sensitive material that can be patterned using a photo imaging process. The PR material can be a positive type or a negative type.

In an aspect, the die 310 and the first and/or the second dams 340 may vertically overlap at least partially. In FIG. 3A, it is illustrated that parts of the first and second lower dam portions are vertically in between the die 310 and the substrate 320. In an aspect, the outer walls of the first and second dams 340 may be at least as wide as the die 310. In FIG. 3A, the outer sidewalls of the first and second dams 340 are illustrated as being outside of the sidewalls of the die 310. In an aspect, the first and second dams 340 may be in contact with at least some portions of the die 310. In FIG. 3A, the sidewalls of the die 310 are illustrated as being in contact with the inner sidewalls of the first and second dams 340 (e.g., with the inner sidewalls of the first and second upper dam portions).

In FIG. 3A, heights of the top surfaces of the die 310 and the first and second dams 340 are illustrated as being substantially equal. While this may be preferred, it should not be viewed as a requirement. Also, the top surfaces of the die 310 and the first and second dams 340 are illustrated as being substantially planar. Again, while this may be preferred, it should not be viewed as a requirement.

Figure 4A:
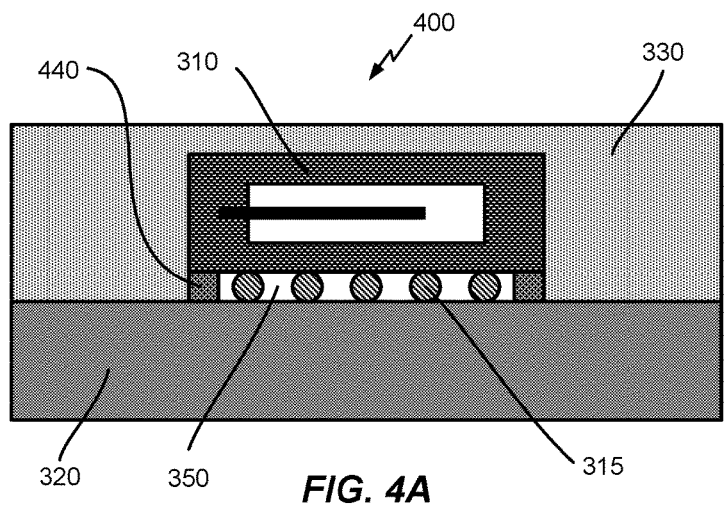
FIGS. 4A and 4B illustrate side and top views of another example package according to an aspect.
Figure 4B:
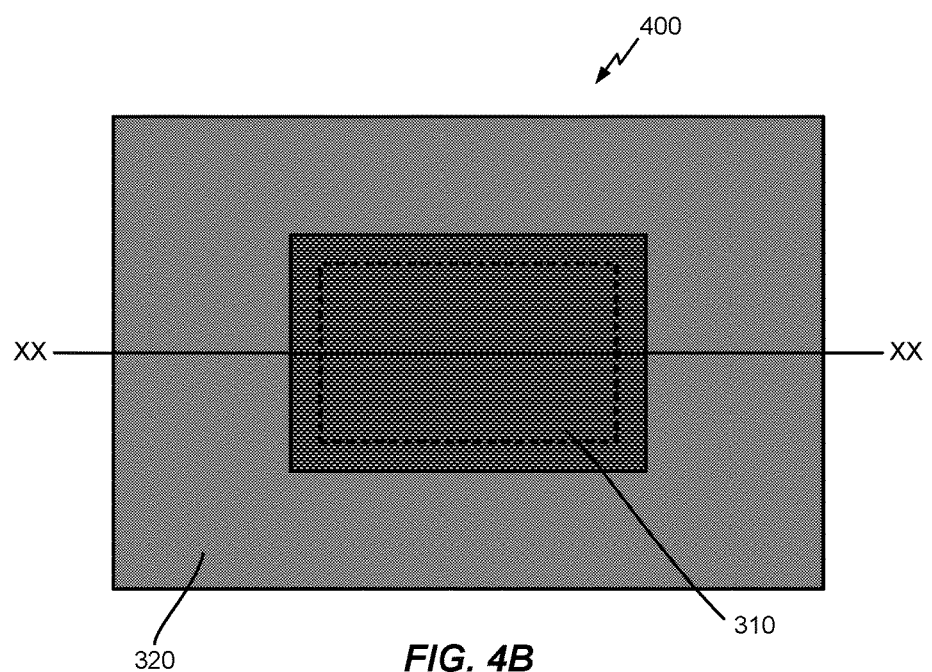

FIGS. 4A and 4B illustrate side and top views of an example package 400 according to an aspect. The view illustrated in FIG. 4A is a side view of the package 400 along the line XX-XX of FIG. 4B. Similar to the package 300, the package 400 may include a die 310 with a plurality of interconnects 315, a substrate 320, and a mold 330. However, instead of the first and second dams 340, the package 400 may include first and second dams 440. The first and second dams 440 of the package 400 may be viewed as alternatives to the first and second dams 340 of the package 300.

The die 310 (e.g., an EMC filter) may be provided above the substrate 320 (e.g., a PCB), the first and second dams 440 may be formed between the die 310 and the substrate 320, and the mold 330 may be formed on the substrate 320 to encapsulate the die 310 and the first and second dams 440. An air cavity 350 may be formed between the die 310 and the substrate 320. The air cavity 350 may be bounded above by the lower surface of the die 310, bounded below by the upper surface of the substrate 320, and bounded on sides by inner sidewalls of the first and second dams 440. The first and second dams 440 may also be viewed as being examples of means for forming the air cavity 350. Some or all of the plurality of interconnects 315 may be within the air cavity 350.

As seen in FIG. 4A, the first and second dams 440 may be entirely in between the lower surface of the die 310 and the upper surface of the substrate 320, i.e., there are no first and second upper dam portions. Also, the outer walls of the first and second dams 440 may be vertically aligned with the sidewalls of the die 310. More generally, the outer sidewalls of the first and second dams 440 and the sidewalls of the die 310 may be substantially coplanar. This is reflected in FIG. 4B (the mold 330 omitted). As seen, the first and second dams 440 are hidden from this top view by the die 310.

Again, in an aspect, the first and second dams 440 may actually be one physical dam 440 formed along the periphery of the die 310. However, the terms such as "first" and "second" will be used so as to be more consistent with the side view of the package 400. The dashed rectangle in FIG. 4B may be viewed as representing the side boundaries of the air cavity 350 when the package 400 is viewed vertically, (e.g., from the top or from the bottom). Between the die 310 and the substrate 320, the first and second dams 440 may occupy the area between the dashed rectangle and the sidewalls of the die 310.

Referring back to FIG. 4A, the inner sidewalls of the first and/or the second dams 440 may be substantially vertical. More generally, the inner sidewalls of the first and/or the second dams 440 may be substantially parallel with the sidewalls of the die 310. Similarly, the outer sidewalls of the first and/or second dams 440 may be substantially vertical, or more generally, substantially parallel with the sidewalls of the die 310.

Recall from above that the sidewalls of the first and second dams 340 of the package 300 enabled a significant reduction in the keep-out zone. The package 400 is even more advantageous in this respect. That is, the package 400 allows for even tighter spacing from adjacent dies and components by further reducing the keep-out zone relative to the package 300.

However, recall that regarding the package 300, the sidewalls of the die 310 are supported by the first and second dams 340. This can be an advantage of the package 300 relative to the package 400 in that the support can enhance the reliability of the package 300.

Figures 5A, 5B:
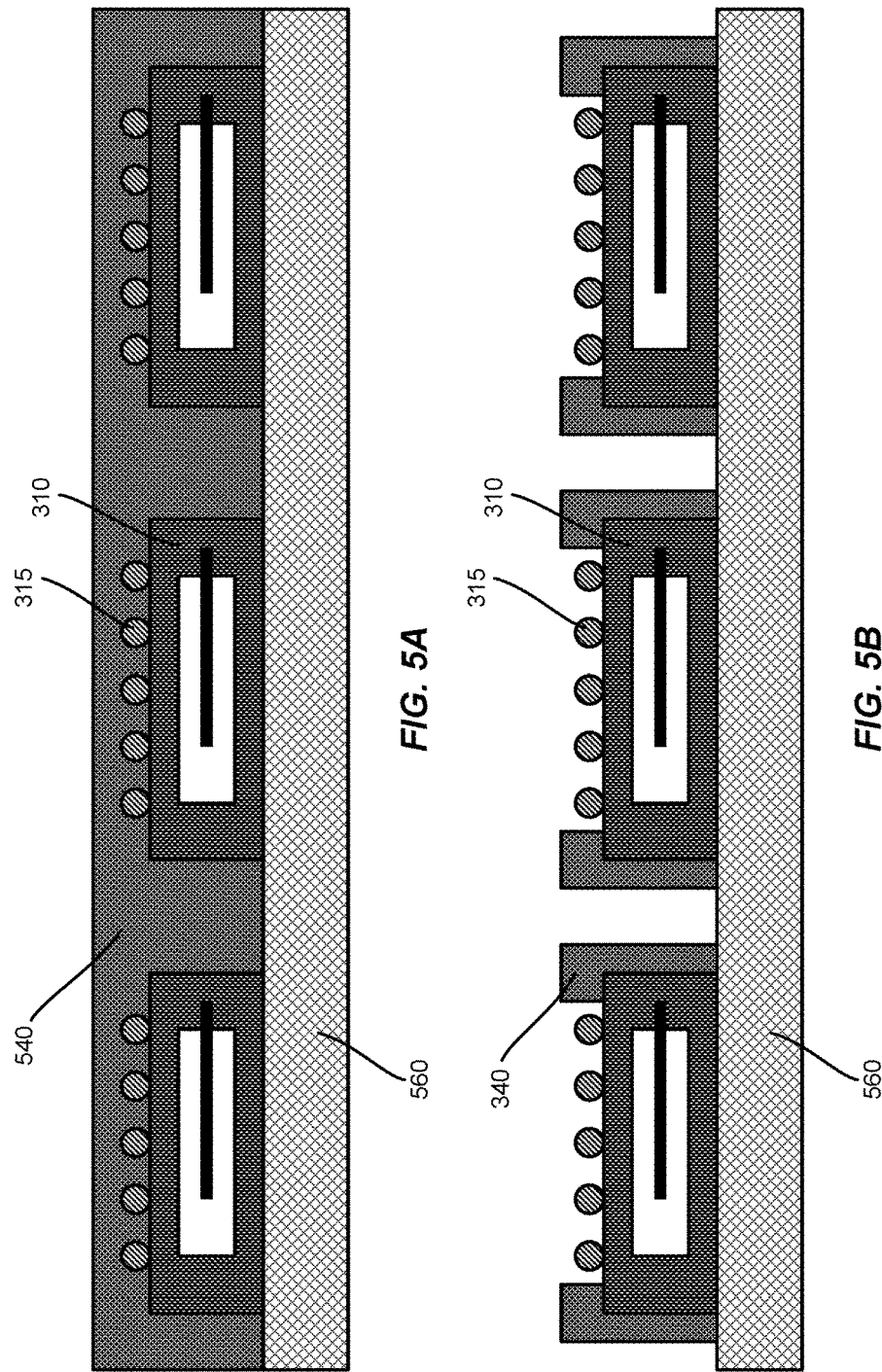
FIGS. 5A-5F illustrate examples of different stages of fabricating the package of FIGS. 3A and 3B according to an aspect.

FIGS. 5A-5F illustrate examples of different stages of fabricating a package such as the package 300 of FIGS. 3A and 3B. FIG. 5A illustrates a stage in which a plurality of dies 310 may be provided on a carrier 560. Examples of the carrier 560 include wafers, metal frames, tapes, and so on. In an aspect, the plurality of dies 310 may be singulated prior to being provided on the carrier 560 individually. In other words, the plurality of dies 310 may be a plurality of singulated dies 310. In this way, the spacings between the individual dies 310 may be controlled. Thereafter, a photoresist (PR) material 540 may be deposited on the carrier 560 and the plurality of dies 310. The PR material 540 may be positive or negative.

FIG. 5B illustrates a stage in which the PR material 540 may be patterned to have openings in areas corresponding to the plurality of interconnects 315 (i.e., corresponding to the air cavities 350), and to have openings in between adjacent dies 310. As a result, the first and second dams 340 may be formed from the patterned PR material 540.

Figure 5C:
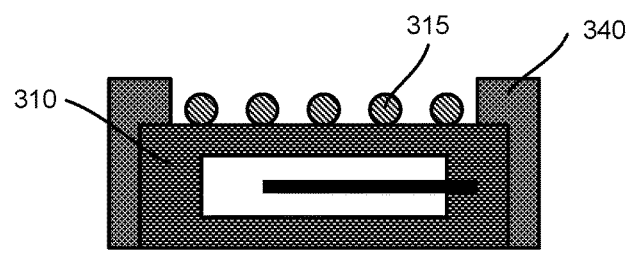

FIG. 5C illustrates a stage in which the carrier 560 may be detached from the die 310 and from the first and second dams 340.

Figure 5D:
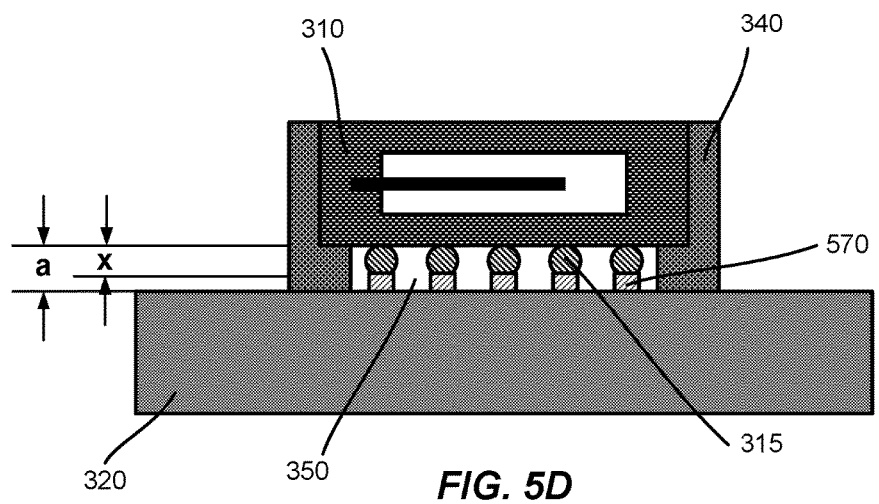

FIG. 5D illustrates a stage in which the die 310 and the first and second dams 340 may be flipped and attached to the substrate 320. In an aspect, a plurality of reflow pastes 570 (e.g., solder paste) may be provided on the substrate 320, and the die 310 may be attached such that the plurality of interconnects 315 are aligned with the plurality of reflow pastes 570.

As seen in FIG. 5D, heights of the lower dam portions of the first and second dams 340 (represented as "a") may be greater than heights of the plurality of interconnects 315 (represented as "x"). The difference in heights can account for the plurality of reflow pastes 570 when the die 310 and the first and second dams 340 are attached to the substrate 320. In an aspect, the PR material 540 may be patterned in the stage of FIG. 5B such that the first and second dams 340 have the appropriate heights in FIG. 5D.

Figure 5E:
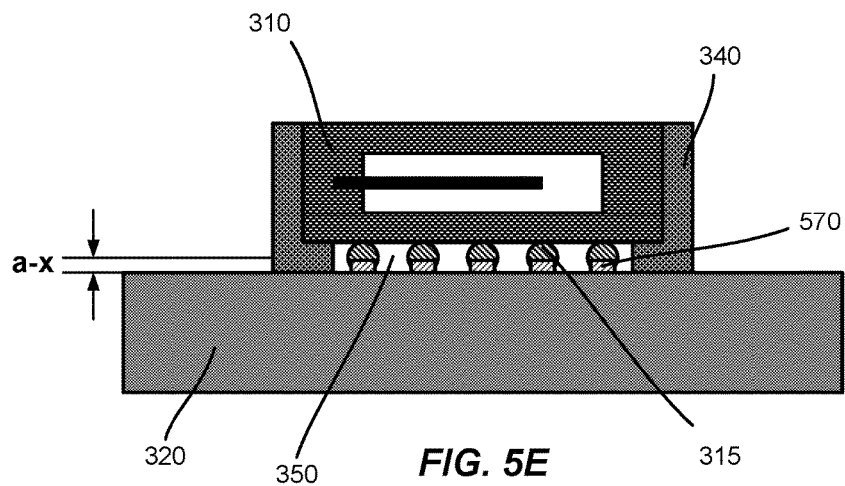

FIG. 5E illustrates a stage in which the package may be subjected to a process to perform a die reflow and to cure the first and second dams 340. In an aspect, the process may result in a "reflow collapse" in which the height of the package 300 may be reduced, e.g., by an amount "a-x". A force of the reflow collapse may strengthen an adherence between the first and second dams 340 and the substrate 320.

Figure 5F:
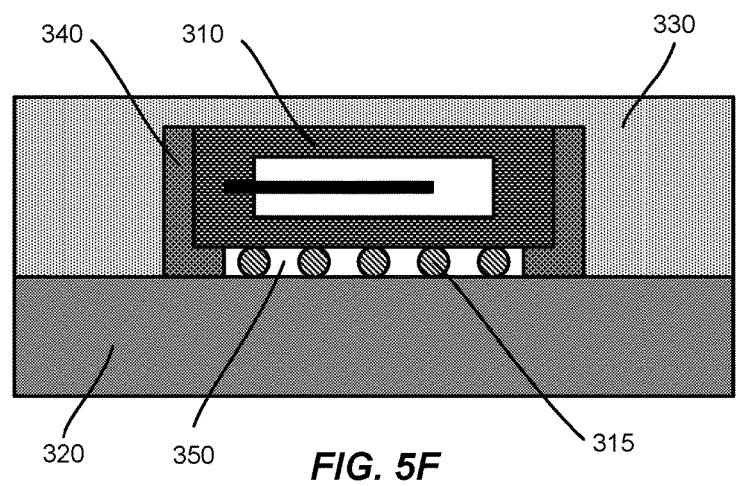

FIG. 5F illustrates a stage in which the mold 330 may be applied to encapsulate the die 310 and the first and second dams 340 on the substrate 320. By strengthening the adherence between the first and second dams 340 and the substrate 320, the integrity of the air cavity 350 may be enhanced. For example, when the material for the mold 330 is applied, the mold 330 may be prevented from seeping into the air cavity 350.

Figure 6C:
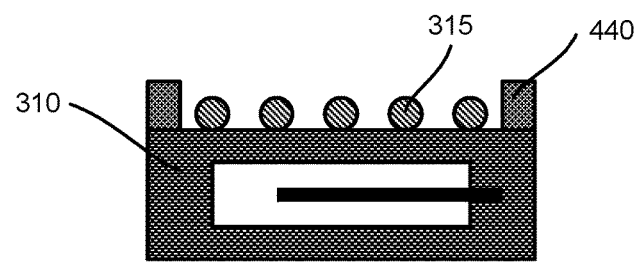

FIGS. 6A-6F illustrate examples of different stages of fabricating a package such as the package 400 of FIGS. 4A and 4B. FIG. 6A illustrates a stage in which a plurality of dies 310 may be provided on a carrier 660. In this stage, it may be assumed that the carrier 660 is a wafer on which the plurality of dies 310 are formed. In other words, the plurality of dies 310 in FIG. 6A have NOT yet been singulated. Note that relative to FIG. 5A, the adjacent dies 310 are spaced much closer together in FIG. 6A. The photoresist (PR) material 640, positive or negative, may be deposited on the wafer 660 to cover the plurality of dies 310.

FIG. 6B illustrates a stage in which the PR material 640 may be patterned to have openings in areas corresponding to the plurality of interconnects 315 (i.e., corresponding to areas of the air cavities 350).

FIG. 6C illustrates a stage in which the carrier 660 may be detached from the die 310 and the first and second dams 440. While not specifically illustrated, it may be assumed that the plurality of unsingulated dies 310 are singulated into individual dies 310 after the PR material 640 is patterned. The act of singulating may form the first and second dams 440 such that the sidewalls of the die 310 and the sidewalls of the first and second dams 440 are aligned.

Figure 6D:
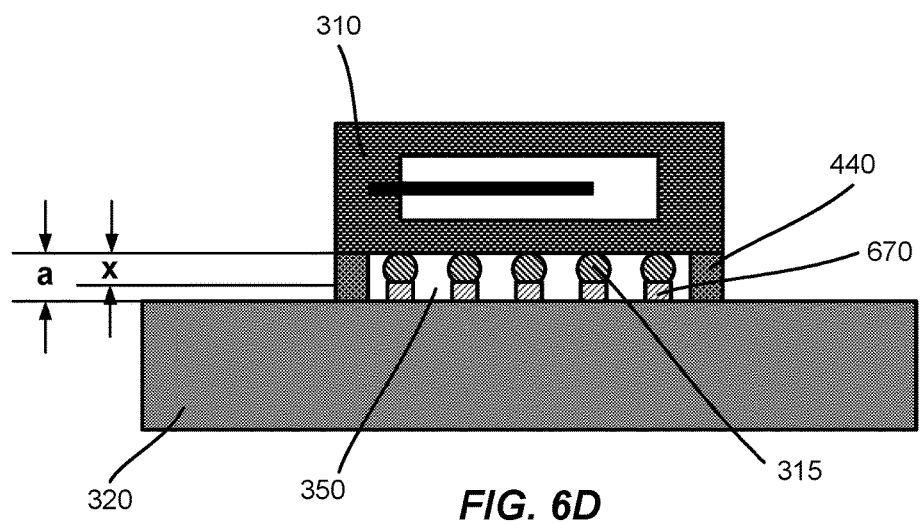

FIG. 6D illustrates a stage in which the die 310 and the first and second dams 440 may be flipped and attached to the substrate 320. In an aspect, a plurality of reflow pastes 670 (e.g., solder paste) may be provided on the substrate 320, and the die 310 may be attached such that the plurality of interconnects 315 are aligned with the plurality of reflow pastes 670.

As seen in FIG. 6D, heights of the first and second dams 440 (represented as "a") may be greater than heights of the plurality of interconnects 315 (represented as "x") to account for the plurality of reflow pastes 670 when the die 310 and the first and second dams 440 are attached to the substrate 320. In an aspect, the PR material 640 may be patterned in the stage of FIG. 6B such that the first and second dams 440 have the appropriate heights in FIG. 6D.

Figure 6E:
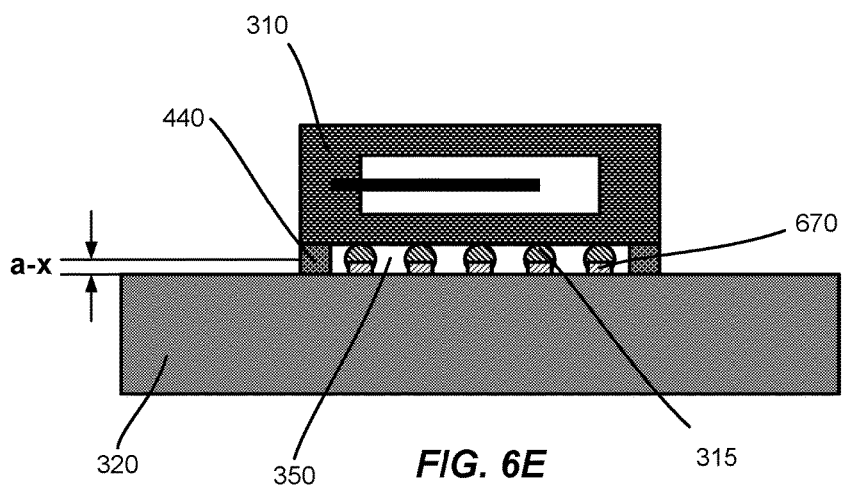

FIG. 6E illustrates a stage in which the package may be subjected to a process to perform the die reflow and to cure the first and second dams 440. In an aspect, the resulting reflow collapse may strengthen an adherence between the first and second dams 440 and the substrate 320. This can enhance the integrity of the air cavity 350.

Figure 6F:
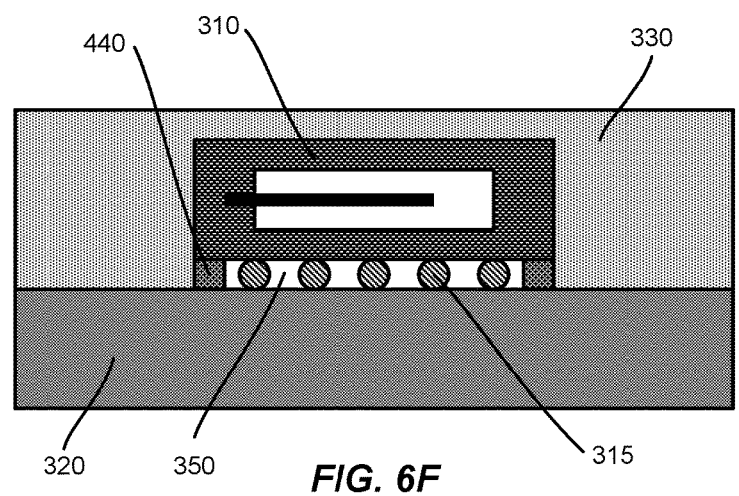

FIG. 6F illustrates a stage in which the mold 330 may be applied to encapsulate the die 310 and the first and second dams 440 on the substrate 320.

Figure 7:
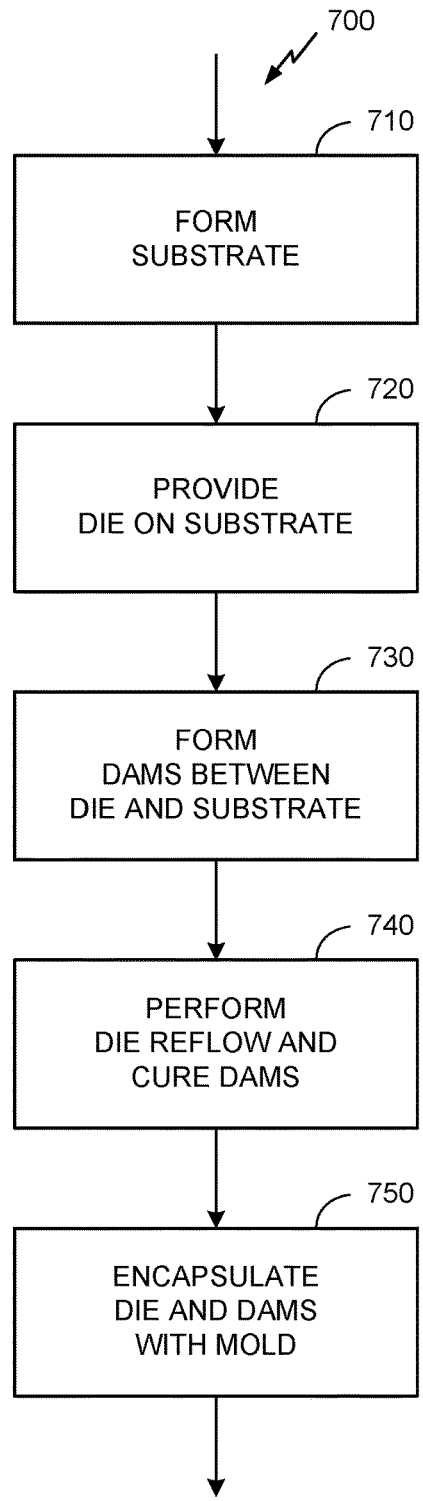
FIG. 7 illustrates a flow chart of an example method of fabricating a package according to an aspect.
Figure 8:
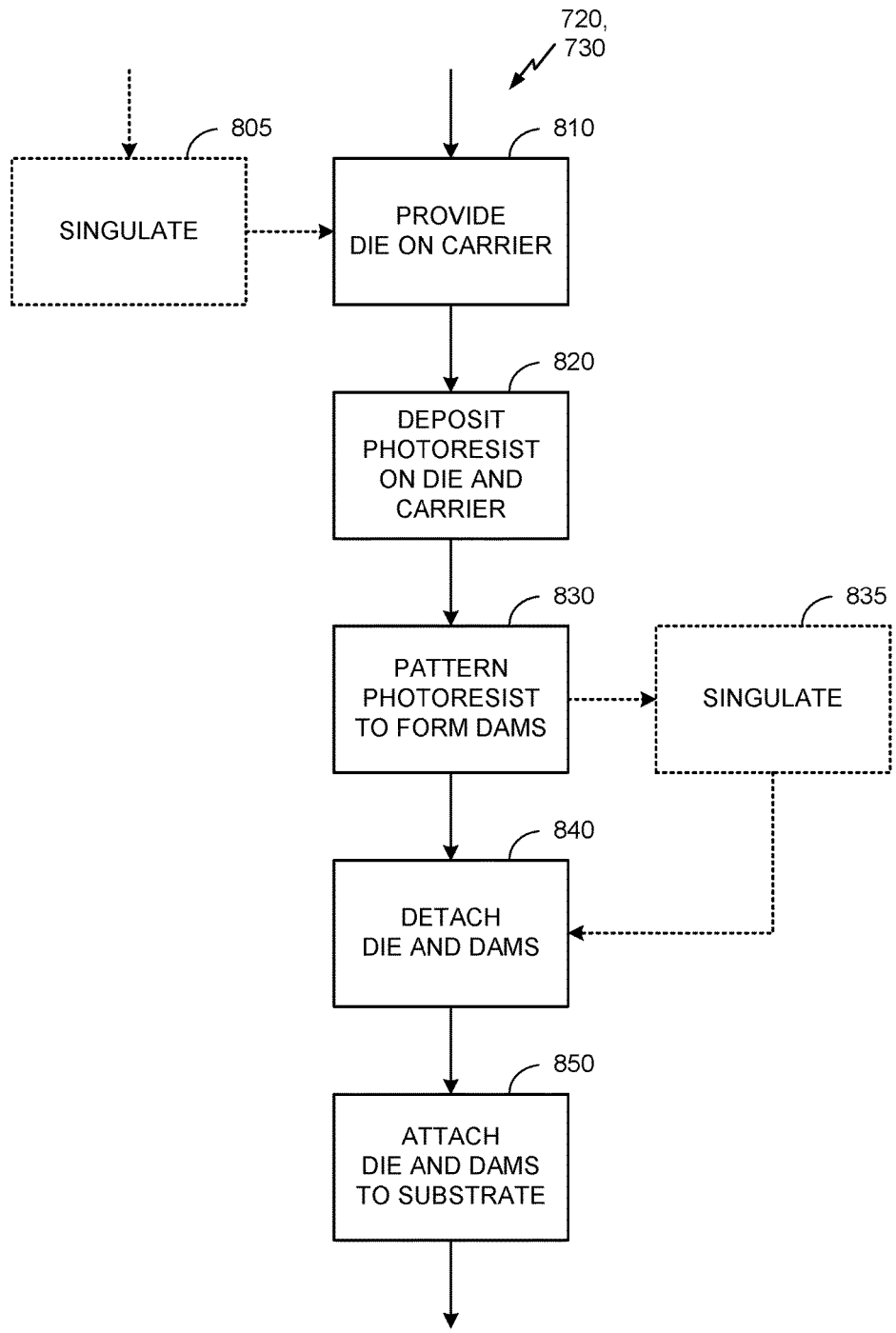
FIG. 8 illustrates a flow chart of an example process of providing a die on a substrate and forming dams in between the die and the substrate according to an aspect.

FIGS. 7 and 8 illustrate flow charts of an example method 700 of fabricating a package such as the package 300 or 400. It should be noted that not all illustrated blocks of FIGS. 7 and 8 need to be performed, i.e., some blocks may be optional. Also, the numerical references to the blocks of these figures should not be taken as requiring that the blocks should be performed in a certain order.

In block 710, the substrate 320 may be formed. In block 720, the die 310 may be provided above the substrate 320. In block 730, the first and second dams 340, 440 may be formed between the die 310 and the substrate 320.

FIG. 8 illustrates a flow chart of an example process to perform blocks 720 and 730. In block 810, the die 310 may be provided on the carrier 560, 660. In block 820, the PR material 540, 640 may be deposited on the die 310. In an aspect, in block 805, the die 310 may be singulated prior to providing the die 310 on the carrier 560 in block 810. FIG. 5A may correspond to blocks 805, 810 and 820 in this aspect.

In an alternative aspect, the die 310 may be one of a plurality of unsingulated dies 310 on the wafer 660. In this instance, block 810 may be viewed as forming the plurality of dies 310 on the wafer 660. FIG. 6A may correspond to block 810 and 820 in this alternative aspect.

In block 830, the PR material 540, 640 may be patterned to form the first and second dams 340, 440 for each of the plurality of dies 310. If the die 310 has been singulated prior to this stage (e.g., in block 805), then FIG. 5B may correspond to block 830. If the die 310 has not yet been singulated, then FIG. 6B may correspond to block 830.

In block 840, the die 310 and the first and second dams 340, 440 may be detached from the carrier 560, 660. In an aspect, the die 310 may have been singulated prior to block 830, and the singulated die 310 along with the first and second dams 340 may be detached from the carrier 560 in block 840. In this instance, FIG. 5C may correspond to block 840.

In an alternative aspect, the PR material 640 deposited over the plurality of unsingulated dies 310 may be patterned in block 830. In this instance, the plurality of unsingulated dies 310 may be singulated in block 835, and then the singulated die 310 along with the first and second dams 440 may be detached from the wafer 660 in block 840. In this instance, FIG. 6C may correspond to block 840.

In block 850, the die 310 and the first and second dams 340, 440 may be attached to the substrate 320. FIG. 5D may correspond to block 850 when the die 310 is singulated in block 805 prior to being provided on the carrier 560 in block 810. FIG. 6D may correspond to block 850 when the die 310 is singulated in block 835 subsequent to patterning the PR material 640 in block 830.

Referring back to FIG. 7, in block 740, the package 300, 400 may be subjected to the process to perform the die reflow and to cure the first and second dams 340, 440. FIGS. 5E and 6E may correspond to block 740. In block 750, the die 310 and the first and second dams 340, 440 may be encapsulated with the mold 330 on the substrate 320. FIGS. 5F and 6F may correspond to block 750.

Figure 9:
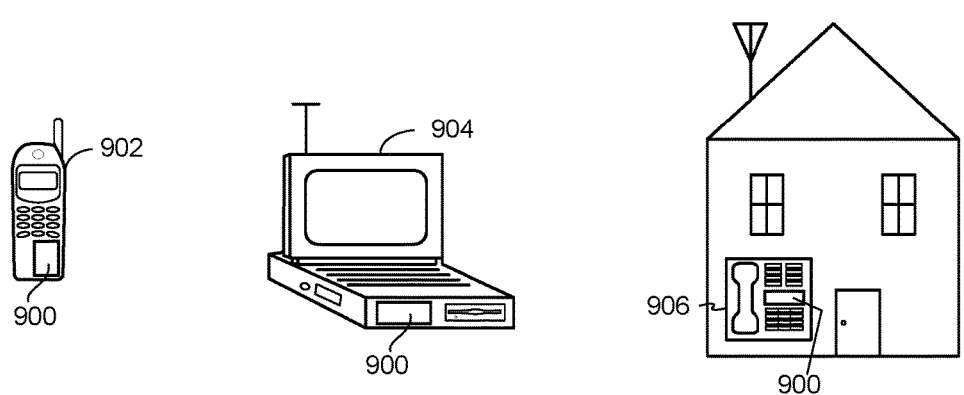
FIG. 9 illustrates examples of devices with a package integrated therein.

FIG. 9 illustrates various electronic devices that may be integrated with any of the aforementioned packages 300, 400. For example, a mobile phone device 902, a laptop computer device 904, a terminal device 906 as well as wearable devices, portable systems, that require small form factor, extreme low profile, may include a device 900 that incorporates the packages 300, 400 as described herein. The device 900 may be, for example, any of the integrated circuits, dies, integrated devices, integrated device packages, integrated circuit devices, device packages, integrated circuit (IC) packages, package-on-package devices, system in package devices described herein. The devices 902, 904, 906 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer-readable media embodying a method of forming a semiconductor device. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A package, comprising:
    a substrate;
    a die above the substrate, the die comprising one or more interconnects configured to electrically couple the die with the substrate;
    first and second dams between the die and the substrate, each of the first and second dams vertically overlapping with the die at least partially between the die and the substrate; and
    a mold on the substrate, the mold encapsulating the die and the first and second dams,
    wherein the mold does not encapsulate the substrate,
    wherein inner and outer sidewalls of the first and second dams are substantially vertical,
    wherein the outer sidewalls of the first and second dams are either vertically aligned with sidewalls of the die or are outside of the sidewalls of the die,
    wherein an air cavity is formed in the package, the air cavity being bounded above by a lower surface of the die, bounded below by an upper surface of the substrate, and bounded on sides by the inner sidewalls of the first and second dams, such that only a single air cavity is formed below the die, and
    wherein some or all of the one or more interconnects are within the air cavity.

2. The package of claim 1, wherein a material of the first and second dams is different from a material of the mold.

3. The package of claim 2, wherein the material of the first and second dams is a photoresist (PR) material.

4. The package of claim 1, further comprising:
    a plurality of interconnects between the die and the substrate,
    wherein the plurality of interconnects are all within the air cavity.

5. The package of claim 1,
    wherein the outer sidewalls of the first and second dams are outside of the sidewalls of the die, and
    wherein the inner sidewalls of the first and second dams are in contact with portions of the sidewalls of the die.

6. The package of claim 5, wherein the inner sidewalls of the first and second dams are in contact with substantially all sidewalls of the die.

7. The package of claim 6, wherein top surfaces of the first and second dams are planar with a top surface of the die.

8. The package of claim 1, wherein the outer sidewalls of the first and second dams are vertically aligned with the sidewalls of the die.

9. A method, comprising:
    forming a substrate;
    providing a die above the substrate, the die comprising one or more interconnects configured to electrically couple the die with the substrate;
    forming first and second dams between the die and the substrate such that each of the first and second dams vertically overlaps with the die at least partially between the die and the substrate; and
    forming a mold on the substrate to encapsulate the die and the first and second dams, wherein the mold is formed such that the substrate is not encapsulated,
wherein the first and second dams are formed such that inner and outer sidewalls of the first and second dams are substantially vertical, and
the outer sidewalls of the first and second dams are either vertically aligned with sidewalls of the die or are outside of the sidewalls of the die,
wherein an air cavity is formed such that the air cavity is bounded above by a lower surface of the die, bounded below by an upper surface of the substrate, and bounded on sides by the inner sidewalls of the first and second dams, such that only a single air cavity is formed below the die, and
wherein the die is provided such that some or all of the one or more interconnects are within the air cavity.

10. The method of claim 9, wherein a material for forming the first and second dams is different from a material for forming the mold.

11. The method of claim 10, wherein the first and second dams are formed from a photoresist (PR) material.

12. The method of claim 9,
wherein a plurality of interconnects are formed on the lower surface of the die, and
wherein the first and second dams are formed such that the plurality of interconnects are all within the air cavity.

13. The method of claim 9, wherein the first and second dams are formed such that
the outer sidewalls of the first and second dams are outside of the sidewalls of the die, and
the inner sidewalls of the first and second dams are in contact with portions of the sidewalls of the die.

14. The method of claim 13, wherein the first and second dams are formed such that the inner sidewalls of the first and second dams are in contact with substantially all sidewalls of the die.

15. The method of claim 14, wherein the first and second dams are formed such that top surfaces of the first and second dams are planar with a top surface of the die.

16. The method of claim 9, wherein the first and second dams are formed such that the outer sidewalls of the first and second dams are vertically aligned with the sidewalls of the die.

17. The method of claim 9, wherein forming the first and second dams between the die and the substrate comprises:
providing the die on a carrier;
depositing a photoresist (PR) material on the die on the carrier;
patterning the PR material to form the first and second dams;
detaching the die and the first and second dams from the carrier; and
attaching the die and the first and second dams to the substrate to form the air cavity.

18. The method of claim 17, further comprising performing a die reflow and curing the first and second dams subsequent to attaching the die and the first and second dams to the substrate.

19. The method of claim 17, further comprising:
singulating the die from a plurality of dies on a wafer prior to providing the die on the carrier,
wherein providing the die on the carrier comprises providing a plurality of singulated dies on the carrier,
wherein depositing the PR material on the die on the carrier comprises depositing the PR material on the plurality of singulated dies on the carrier, and
wherein patterning the PR material comprises patterning the PR material to form pluralities of first and second dams corresponding to the plurality of singulated dies.

20. The method of claim 17,
wherein the carrier is a wafer such that providing the die on the carrier comprises forming a plurality of dies on the wafer,
wherein depositing the PR material on the die on the carrier comprises depositing the PR material on the plurality of dies on the wafer,
wherein patterning the PR material comprises patterning the PR material to form pluralities of first and second dams corresponding to the plurality of dies, and
wherein the method further comprises singulating the die and the corresponding first and second dams from other dies and other first and second dams subsequent to patterning the PR material.

21. A package, comprising:
a substrate;
a die above the substrate, the die comprising one or more interconnects configured to electrically couple the die with the substrate;
means for forming an air cavity between the die and the substrate, the means for forming the air cavity vertically overlapping with the die at least partially between the die and the substrate; and
means for encapsulating the die and the means for forming the air cavity on the substrate,
wherein the means for encapsulating does not encapsulate the substrate,
wherein inner and outer sidewalls of the means for forming the air cavity are substantially vertical,
wherein the outer sidewalls of the means for forming the air cavity are either vertically aligned with sidewalls of the die or are outside of the sidewalls of the die,
wherein the air cavity is bounded above by a lower surface of the die, bounded below by an upper surface of the substrate, and bounded on sides by the inner sidewalls of the means for forming the air cavity, such that only a single air cavity is formed below the die, and
wherein some or all of the one or more interconnects are within the air cavity.

22. The package of claim 1, wherein the substrate is a printed circuit board.

23. The method of claim 9, wherein the substrate is a printed circuit board.

24. The package of claim 21, wherein the substrate is a printed circuit board.

25. The package of claim 5, wherein the first dam comprises first lower and upper dam portions and/or the second dam comprises second lower and upper dam portions,
the first lower dam portion being a portion of the first dam between a lower surface of the die and an upper surface of the substrate and/or the second lower dam portion being a portion of the second dam between the lower surface of the die and the upper surface of the substrate,
the first upper dam portion being a portion of the first dam above the lower surface of the die and/or the second upper dam portion being a portion of the second dam above the lower surface of the die,
an inner sidewall of the first upper dam portion being in contact with the sidewall of the die and/or an inner sidewall of the second upper dam portion being in contact with the sidewall of the die, and
a part of the first lower dam portion being vertically in between the die and the substrate so as to be in contact with the lower surface of the die and/or a part of the second lower dam portion being vertically in between the die and the substrate so as to be in contact with the lower surface of the die.

26. The method of claim 13, wherein the first and second dams are formed such that the first dam comprises first lower and upper dam portions and/or the second dam comprises second lower and upper dam portions, the first lower dam portion being a portion of the first dam between a lower surface of the die and an upper surface of the substrate and/or the second lower dam portion being a portion of the second dam between the lower surface of the die and the upper surface of the substrate, the first upper dam portion being a portion of the first dam above the lower surface of the die and/or the second upper dam portion being a portion of the second dam above the lower surface of the die, an inner sidewall of the first upper dam portion being in contact with the sidewall of the die and/or an inner sidewall of the second upper dam portion being in contact with the sidewall of the die, and a part of the first lower dam portion being vertically in between the die and the substrate so as to be in contact with the lower surface of the die and/or a part of the second lower dam portion being vertically in between the die and the substrate so as to be in contact with the lower surface of the die.

* * * * *